(12) United States Patent
Ivanov et al.

(10) Patent No.: US 6,927,624 B2
(45) Date of Patent: Aug. 9, 2005

(54) METHOD AND CIRCUIT FOR IMPROVING CONTROL OF TRIMMING PROCEDURE

(75) Inventors: Vadim V. Ivanov, Tucson, AZ (US); Stephen J. Sanchez, Tucson, AZ (US); David M. Jones, Tucson, AZ (US); David Spady, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 75 days.

(21) Appl. No.: 10/461,117

(22) Filed: Jun. 12, 2003

(65) Prior Publication Data

US 2004/0251959 A1 Dec. 16, 2004

(51) Int. Cl.[7] .............................................. G01R 19/00
(52) U.S. Cl. ............................. 330/2; 330/9; 330/307
(58) Field of Search .................................. 330/2, 9, 307

(56) References Cited

U.S. PATENT DOCUMENTS

| | | | | |
|---|---|---|---|---|
| 5,694,366 A | * | 12/1997 | Chevallier et al. | 365/207 |
| 6,338,032 B1 | * | 1/2002 | Chen | 703/16 |
| 6,459,335 B1 | * | 10/2002 | Darmawaskita et al. | 330/9 |
| 6,573,783 B2 | * | 6/2003 | Gray | 330/9 |
| 6,621,284 B2 | * | 9/2003 | D'Angelo | 324/763 |
| 6,628,169 B2 | * | 9/2003 | Ivanov et al. | 330/256 |

* cited by examiner

Primary Examiner—Patricia Nguyen
(74) Attorney, Agent, or Firm—W. Daniel Swayze, Jr.; W. James Brady; Frederick J. Telecky, Jr.

(57) ABSTRACT

A method and circuit is provided for improving the control of the trimming procedure for various devices without the need for additional dedicated control pins. Instead, the trimming procedure is controlled through sensing of changes in current and/or voltage applied through the existing available pins or bondpads of the devices to determine whether a command for trim programming has occurred. As a result, package-level trimming of the devices can be conducted in standard device packages having low pin count configurations, such as operational amplifiers, instrumentation amplifiers, difference amplifiers, low drop-out regulators, voltage references and other similar types of devices. A device to be trimmed is configured with internal circuitry configured to sense changes in current and/or voltage in the output or supply voltage of the device, and a test system for applying changes in the current and/or voltage through the existing available pins or bondpads of the devices. The internal circuitry can comprise sensing circuitry comprising one or more internal sensors configured to measure current and/or voltage in the output or supply voltage of the device, and can comprise trim programming circuitry for facilitating trim programming of the device.

15 Claims, 2 Drawing Sheets

US 6,927,624 B2

METHOD AND CIRCUIT FOR IMPROVING CONTROL OF TRIMMING PROCEDURE

FIELD OF INVENTION

The present invention relates to the trimming of amplifier devices. More particularly, the present invention relates to a method and circuit for controlling the trimming procedure in various devices, such as amplifiers, references, regulators and the like.

BACKGROUND OF THE INVENTION

Operational amplifiers, instrumentation amplifiers, difference amplifiers, low drop-out regulators, voltage references and other similar types of devices typically are trimmed during or after manufacture to improve the precision and accuracy of the devices. Some of the main objectives for trimming techniques include the correction of offset, gain and temperature drift, among other parameters, in the devices. Modem trimming techniques for the initial production adjustment of offset, gain and other device parameters generally comprise some type of on-chip digital memory, for example in the form of EPROM or fuse links. During the trimming process, test circuitry is often used to measure the device parameters to make a determination as to how many and which of the specific memory cells should be programmed from the initial value, i.e., should be programmed from a "zero" or "low" state to the opposite "one" or "high" state.

Once the determination is made as to how many and which of the specific memory cells should be programmed, the information from the test circuitry must be transferred to an internal programming cell on the chip or device. To transfer this information, dedicated pins are used to facilitate communication. For serial communication protocols, at least two dedicated pins are necessary, while other devices and protocols can require more.

The requirement for additional dedicated pins can be a problem if the device under testing or trimming comprises a low pin count part with a standard pin output configuration, such as conventional operational amplifiers, voltage references, low drop-out regulators, and other like devices. Thus, controlling the trimming procedure in such devices having limited pin count configurations can be difficult.

SUMMARY OF THE INVENTION

In accordance with various aspects of the present invention, a method and circuit is provided for improving the control of the trimming procedure for various devices without the need for additional dedicated control pins. Instead, the trimming procedure is controlled through sensing of changes in current and/or voltage applied through the existing available pins or bondpads of the devices to determine whether a command for trim programming has occurred. As a result, package-level trimming of the devices can be conducted in standard device packages having low pin count configurations, such as operational amplifiers, instrumentation amplifiers, difference amplifiers, low drop-out regulators, voltage references and other similar types of devices.

In accordance with an exemplary embodiment of the present invention, a device to be trimmed is configured with internal circuitry configured to sense changes in current and/or voltage in the output or supply voltage of the device, and a test system for applying changes in the current and/or voltage through the existing available pins or bondpads of the device. The internal circuitry can comprise sensing circuitry comprising one or more internal sensors configured to measure current and/or voltage in the output or supply voltage of the device, and can comprise trim programming circuitry for facilitating trim programming of the device. To provide changes in the current and/or voltage, the test system can comprise one or more additional positive and/or negative current sources, or an additional voltage supply. Accordingly, the test system can generate changes in the current and/or voltage through the existing available pins or bond pads of the device to provide trim commands for programming of the clock signal and/or a trim signal.

In accordance with an exemplary embodiment of the present invention, an exemplary method for control of the trimming procedure can comprise the steps of providing a command signal to the existing pins of a device to be trimmed, sensing a change in the current and/or voltage in the pins and interpreting a trim command signal, providing a programming signal to the trim programming circuitry, and conducting the trim programming.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

The present invention may be described herein in terms of various functional components and various processing steps. It should be appreciated that such functional components may be realized by any number of hardware or structural components configured to perform the specified functions. For example, the present invention may employ various integrated components, e.g., buffers, voltage and current references, memory components and the like, comprised of various electrical devices, e.g., resistors, transistors, capacitors, diodes or other devices, whose values may be suitably configured for various intended purposes. In addition, the exemplary methods and circuits may be practiced in any microcontroller or electronics based application, such as instrumentation amplifiers, voltage references, regulators, DAC's and other like devices. However for purposes of illustration only, exemplary embodiments of the present invention are described herein in connection with the trimming of an operational amplifier and a voltage reference, and that the present invention is not limited to the embodiments disclosed. Further, it should be noted that while various components may be suitably coupled or connected to other components within exemplary circuits, such connections and couplings can be realized by direct connection between components, or by connection through other components and devices located therebetween.

As discussed above, prior art trimming techniques generally require dedicated pins for communication of the trim programming signals from external circuitry. This requirement for additional dedicated pins is problematic for devices with a low pin count or with standard pin configurations, such as operational amplifiers, references, regulators and the like.

However, in accordance with various aspects of the present invention, a method and circuit is provided for improving the control of the trimming procedure for various devices without the need for additional dedicated control pins. Instead, the trimming procedure is controlled through sensing of changes in current and/or voltage applied through the existing available pins or bondpads of the devices to determine whether a command for trim programming has occurred. As a result, package-level trimming of the devices can be conducted in standard device packages having low pin count configurations, such as operational amplifiers, instrumentation amplifiers, difference amplifiers, low drop-out regulators, voltage references and other similar types of devices.

Figure 1:
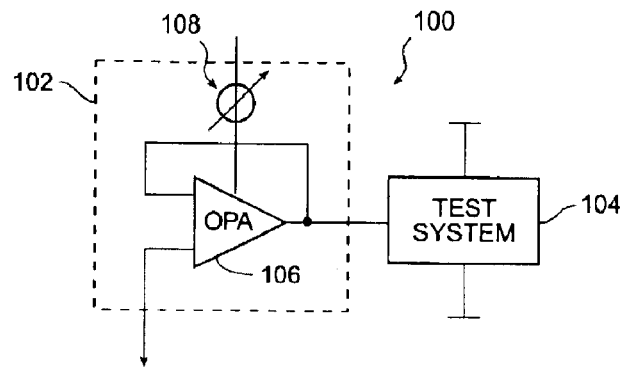
FIG. 1 illustrates a block diagram of an exemplary circuit for improving control of the trimming procedure in a device in accordance with an exemplary embodiment of the present invention.

In accordance with an exemplary embodiment of the present invention, with reference to FIG. 1, an exemplary trimming circuit 100 for improving control of the trimming procedure in a device is illustrated. Trimming circuit 100 comprises an internal circuitry 102 and a test system 104.

Internal circuitry 102 comprises a device 106 to be trimmed that is configured with sensing and programming circuitry 108. Device 106 is illustrated as an operational amplifier, but can comprise any other types of amplifiers, including instrumentation amplifiers and difference amplifiers, low drop-out regulators, voltage references and other similar types of devices. In the exemplary embodiment, device 106 can comprise three external pins or terminals, including a supply voltage terminal, a ground terminal and an output terminal, but can also comprise additional or fewer pins. For example with momentary reference to FIGS. 2 and 3, a device 206 or 302 can comprise three external pins including a supply voltage terminal $V_{IN}$, a ground terminal and an output terminal $V_{OUT}$.

In that the output terminals of operational amplifiers, references, regulators difference amplifiers and the like that can comprise device 106 are configured in a feedback loop with device 106, an output voltage $V_C$ on the output terminal is suitably controlled regardless of the amount of current flowing through the output terminal. Thus, increases or decreases in the current flowing in the output terminal do not affect the output voltage, and can be suitably measured by sensing and programming circuitry 108. In addition, devices such as operational amplifiers, references, regulators difference amplifiers and the like that can comprise device 106 have a very small sensitivity to changes in the supply voltage; thus changes in the supply voltage do not affect operation of device 106, and can be suitably measured by sensing and programming circuitry 108 to determine if a command signal has been sent by test system 104.

Sensing and programming circuitry 108 is configured to sense changes in current and/or voltage in the output or supply voltage of device 106 and provide trim programming to device 106. Sensing and programming circuitry 108 is preferably configured internally with device 106, i.e., on-chip, but in some embodiments can be externally configured. In addition, sensing and programming circuit 108 can comprise a single circuit or device or sensing and programming, or separate devices. The sensing component of circuitry 108 can comprise one or more internal sensors configured to measure changes in current and/or voltage in the output or supply voltage terminals of device 106, e.g., the sensing component of circuitry 108 can comprise one or more decoders or other like devices to detect whether command trim signals have been sent by test system 104.

Figure 2:
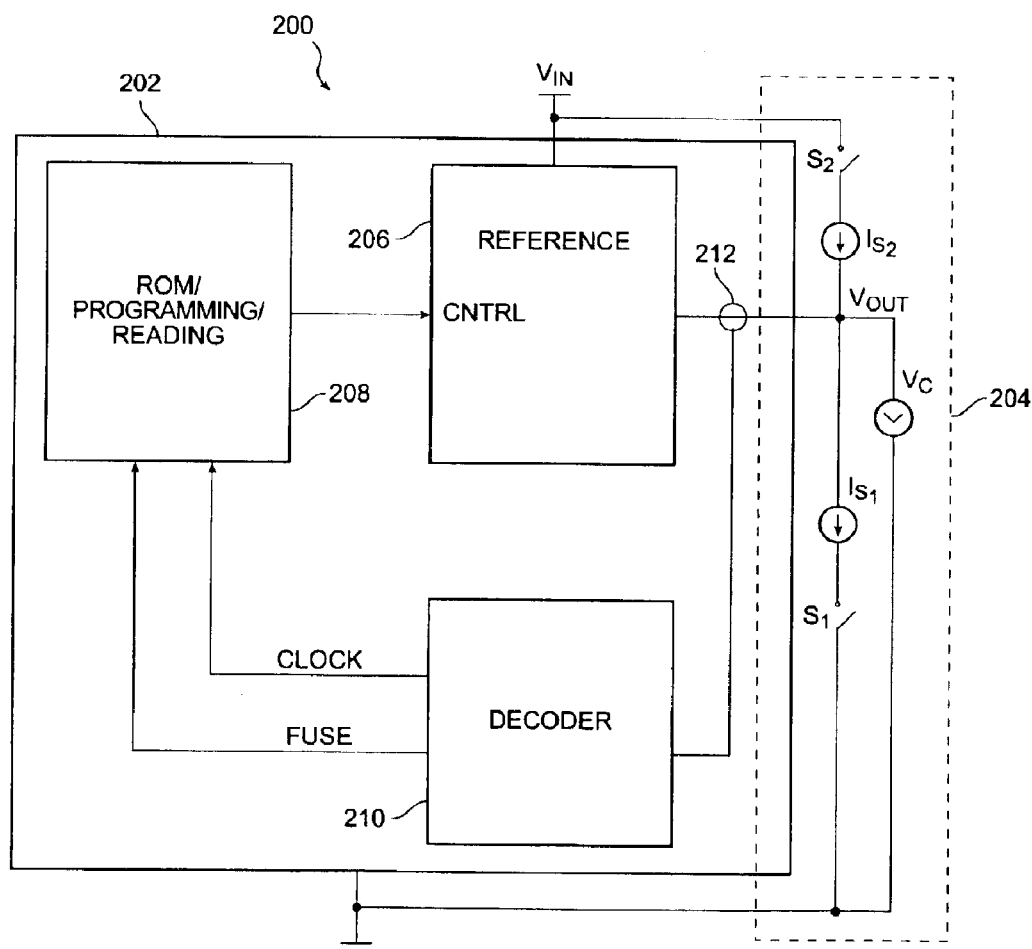
FIG. 2 illustrates a block diagram of an exemplary circuit for improving control of the trimming procedure in a device in accordance with another exemplary embodiment of the present invention.
Figure 3:
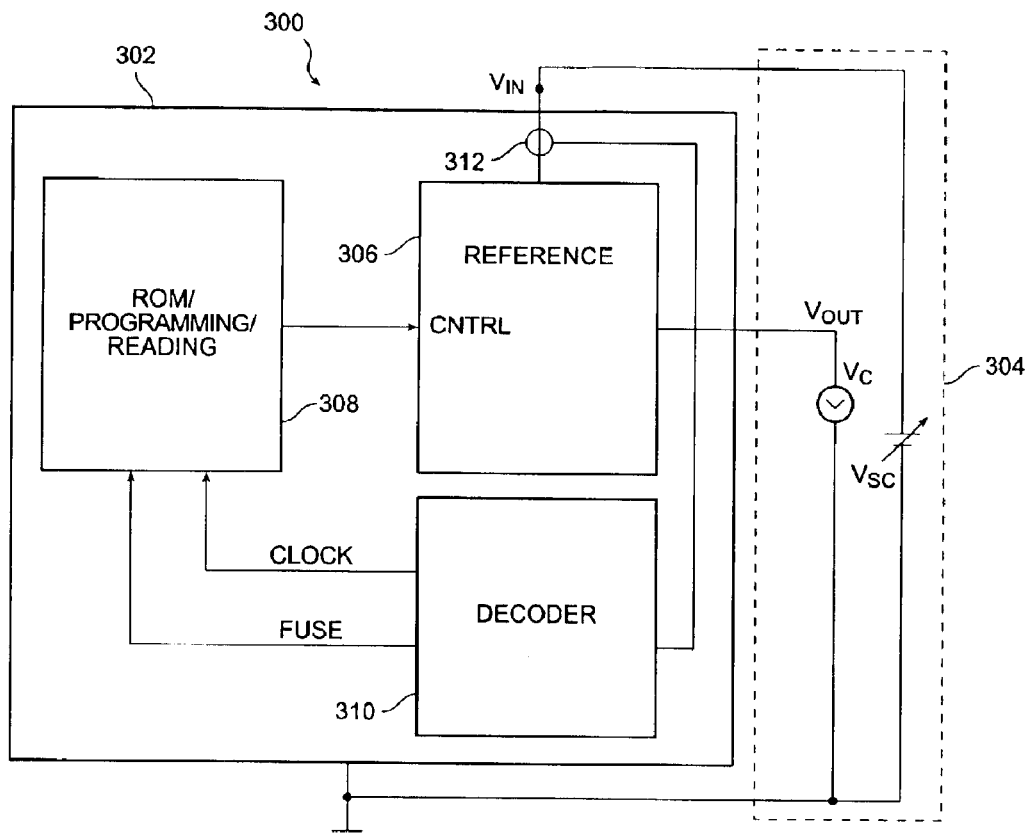
FIG. 3 illustrates a block diagram of an exemplary circuit for improving control of the trimming procedure in a device in accordance with another exemplary embodiment of the present invention.

For example, with momentary reference to FIGS. 2 and 3, in accordance with an exemplary embodiment, an internal circuit 202 or 302 can comprise a decoder 210 configured with a current sensor 212 for sensing the output current, or a decoder 310 configured with a voltage sensor 312 for sensing the supply voltage, respectively. Decoders 210 and 310 can comprise any type of decoder or other circuit for determining whether a command signal has been sent by test system 104. Decoders 210 and 310 comprise an output configuration for providing "clock" or advance command signals and for providing "fuse" command signals. For example, decoders 210 and/or 310 can comprise two output pins, one for "fuse" signals and the other for "clock" signals. In addition, decoders 210 and/or 310 can be configured with only a single output pin for only one command comprising either "fuse" or "clock" command signals, with the absence of a signal from the single output pin representing the other command signal. While internal circuit 202 and 302 illustrate only a single decoder, in accordance with other exemplary embodiments, an internal circuit can comprise both a decoder 210 configured with current sensor 212 for sensing the output current, and a decoder 310 configured with voltage sensor 312 for sensing the supply voltage. Further, an internal circuit can also comprise a single decoder configured with both a current sensor 212 for sensing the output current and a voltage sensor 312 for sensing the supply voltage.

Meanwhile, the trim programming component of circuitry 108 is configured to receive trim programming signals from the sensing circuitry and can comprise any circuitry or component for trimming of devices, such as laser trimming, fusing or blowing the link, charging the gate of EPROM devices, or any other technique or circuit for providing trim programming to device 106. Again, with momentary reference to FIGS. 2 and 3, in accordance with an exemplary embodiment, the trimming programming component can comprise a ROM and programming circuit 208 or 308 configured for receiving command signals from decoders 210 or 310, and for programming of memory cells in a reference device 206 or 306.

Test system 104 is configured for providing changes in the current and/or voltage at the existing available pins or bondpads of device 106. For example, to provide changes in the current at the output terminal of device 106, test system 104 can comprise one or more positive and/or negative current sources to change the amount of current flowing through the output terminal. To provide changes in the voltage level at the supply voltage terminal of device 106, test system 104 can comprise an additional voltage supply to increase or decrease the amount of voltage at the supply voltage terminal. Accordingly, test system 104 can generate changes in the current and/or voltage at the existing available pins or bondpads of device 106, thus enabling sensing and programming circuitry 108 to detect the changes and provide corresponding trim commands for programming of the clock signal and/or a trim signal of device 106.

Figure 4:
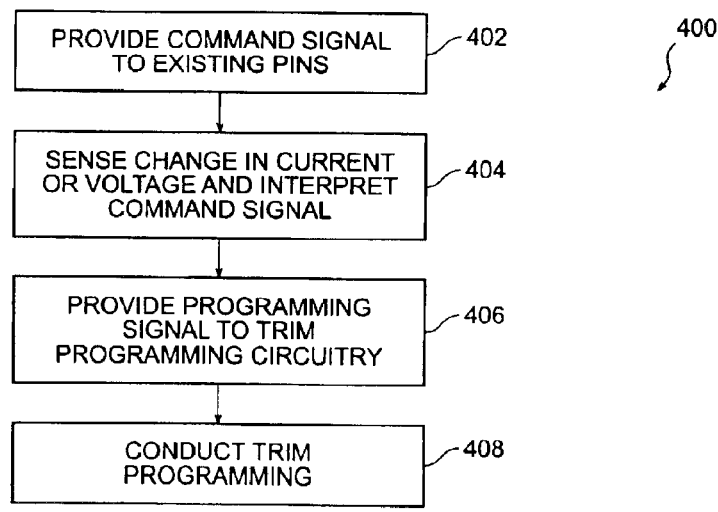
FIG. 4 illustrates an exemplary method for control of the trimming procedure in a device in accordance with an exemplary embodiment of the present invention.

An exemplary method for control of the trimming procedure of trimming circuit 100 is illustrated in the diagram of FIG. 4. In accordance with an exemplary embodiment of the present invention, an exemplary method 400 for control of the trimming procedure can comprise a step 402 of providing a command signal to the existing pins of a device to be trimmed. The command signal is suitably provided by test system 104 in the form of a change in the current signal or voltage signal at an existing pin terminal, e.g., a change of the current flowing in the output terminal, or a change in the amount of voltage at the supply voltage terminal. The command signal is configured to represent a command for trim programming. The type of command signal, e.g., whether to "clock" or advance to the next programming bit, or whether to "fuse" or trim the bit, or whether not to "fuse" and simply advance to the next programming bit, can be selected from within test system 104, or within another micro-processor or other control system coupled to test system 104. The decision for the type of command signal for each memory cell can be based on the measurement by test system 104 of the output or supply voltage terminals of the device.

Upon providing a command signal to the existing pins, in a step 404, sensing circuitry of circuitry 108 is configured for sensing a change in the current and/or voltage in the existing pins and interpreting a trim command signal. For example, the sensing circuitry can comprise a sensor for measuring the current flowing in the output terminal of the device 106, and/or a sensor for measuring the amount of voltage in the supply voltage terminal of device 106. Upon measuring the current and/or voltage in the existing pin terminals, sensing circuitry 108 can suitably determine whether a trim programming command signal has been delivered and the type of command signal, e.g., whether to "clock" or advance to the next programming bit, or whether to "fuse" or not "fuse" the bit.

In a step 406, the sensing circuitry of circuitry 108 is configured for providing a programming signal to the trim programming circuitry of circuitry 108. For example, if the current programming bit is acceptable, the sensing circuitry may simply provide a signal to "clock" or advance to the next programming bit; if the bit is to be programmed, then a signal can be provide to "fuse" or trim the bit, followed by a signal to advance to the subsequent bit. After the programming signal is provided in step 406, the conducting of the trim programming can occur in a step 408. For example, the bit can be fused, or the trim programming circuitry can advance to the subsequent bit for programming. Such a trimming process can continue until all the bits have been measured and programmed, wherein sensing and trim programming circuitry 108 can be suitably disabled.

As discussed above, test system 104 can be configured for providing changes in the current signal and/or voltage signal at the existing pins terminals. For example, with reference to FIG. 2, an exemplary trimming circuit 200 can comprise a test system 204 configured to provide changes in the current at an output terminal $V_{OUT}$ of a reference device 206. In accordance with an exemplary embodiment, test system 204 can comprise one or more positive and/or negative current sources to change the amount of current flowing through the output terminal. For example, test system 204 can comprise a current source $I_{S1}$ and/or a current source $I_{S2}$ for increasing or decreasing the amount of current flowing within output terminal $V_{OUT}$. Current sources $I_{S1}$ and/or $I_{S2}$ can be suitably coupled between a ground terminal or a supply voltage terminal $V_{IN}$ to output terminal $V_{OUT}$ by various switch configurations, such as switches $S_1$ and $S_2$, or any other switching configuration comprising any switching technique now known or hereinafter devised. In addition, current sources $I_{S1}$ and/or $I_{S2}$ can comprise various types of current source configurations, such as a resistor coupled between the ground terminal and output terminal $V_{OUT}$, or a resistor coupled between supply voltage terminal $V_{IN}$ and output terminal $V_{OUT}$, or any other current source circuit.

The increase or decrease in current provided by current sources $I_{S1}$ and/or $I_{S2}$ can suitably correspond to various command signals. For example, an increase in current flowing in output terminal $V_{OUT}$ can represent a command to "fuse" a programming bit, with a decrease in current representing a command to advance to the subsequent programming bit without "fusing" the bit, or vice versa. In addition, if the change in current is minimal or nonexistent, a command signal can be interpreted, e.g., if an increase in current, "fuse" the bit, and if no increase in current, advance to the subsequent bit. Various other scenarios for increases, decreases or maintenance of current can be utilized to signal a particular trim command signal.

With reference to FIG. 3, an exemplary trimming circuit 300 can comprise a test system 304 configured to provide changes in the current at an output terminal $V_{OUT}$ of a reference device 206. In accordance with an exemplary embodiment, to provide changes in the voltage level at supply voltage terminal $V_{IN}$ of device 306, test system 304 can comprise an additional voltage supply or circuit to increase or decrease the amount of voltage at supply voltage terminal $V_{IN}$. Test system 304 can comprise any type of voltage source or circuit for changing the amount of voltage at supply voltage terminal $V_{IN}$. For example, test system 304 can comprise an additional voltage supply $V_{SC}$ coupled between supply voltage terminal $V_{IN}$ and ground, or any other voltage source circuit configured in series and/or parallel to supply voltage terminal $V_{IN}$ to increase the amount of voltage. The additional voltage source or circuit can comprise a variable voltage source, and/or can be suitably configured to change the amount of voltage through various switching configurations. While the additional voltage source can be suitably configured in polarity to decrease the supply voltage, the additional voltage source may be preferred to increase the supply voltage since it can be more desirable to have as high a supply voltage as the device will allow during the programming phase without destruction of the trimming circuit.

Accordingly, an exemplary test system 204 or 304 can generate changes in the current and/or voltage at the existing available pins or bondpads of a device, such as operational amplifiers, references, regulators difference amplifiers and the like, thus enabling sensing and programming circuitry to detect the changes and provide corresponding trim commands for programming of the clock signal and/or a trim signal of the device. In addition, while the exemplary embodiment of FIGS. 2 and 3 illustrate a current sensing configuration and a voltage sensing configuration, respectively, combinations of these sensing techniques can be provided. For example, an exemplary test system can comprise one or more current sources $I_{S1}$ and/or $I_{S2}$ and an additional voltage supply $V_{SC}$ to provide changes to both the load current and the supply voltage, e.g., a change in the load current representing a "clock" command signal, and a change in the supply voltage representing a "fuse" command signal, or vice versa.

The present invention has been described above with reference to exemplary embodiments. However, those skilled in the art will recognize that changes and modifications may be made to the exemplary embodiment without departing from the scope of the present invention. For example, the various components may be implemented in alternate ways, such as varying or alternating the steps in different orders. These alternatives can be suitably selected depending upon the particular application or in consideration of any number of factors associated with the operation of the trimming circuits. These and other changes or modifications are intended to be included within the scope of the present invention.

What is claimed is:

1. A trimming circuit for facilitating control of the trimming procedures, said trimming circuit comprising:
   a device to be trimmed;
   a test system for providing changes to at least one of a current signal and a voltage signal in existing terminal pins of said device, said changes representative of a trim command signal; and
   an internal circuit configured for sensing changes in at least one of said current signal and said voltage signal and for determining whether a trim command signal has been delivered,
   wherein said test system comprises a voltage source for changing an amount of voltage in a supply voltage terminal of said device, and
   wherein said trimming circuit further comprises at least one current source configured for switching current load in an output terminal of said device.

2. The trimming circuit according to claim 1, wherein said test system comprises at least one current source configured for switching current load in an output terminal of said device.

3. The trimming circuit according to claim 1, wherein said at least one current source is configured with at least one switch for coupling to said output terminal.

4. The trimming circuit according to claim 1, wherein said test system comprises a first one current source configured for increasing current load in said output terminal of said device, and a second current source configured for decreasing current load in said output terminal of said device.

5. The trimming circuit according to claim 1, wherein said internal circuit comprises at least one of a current sensor and a voltage sensor for sensing changes in at least one of said current signal and said voltage signal.

6. The trimming circuit according to claim 5, wherein said internal circuit comprises a decoder for determining whether a trim command signal has been delivered.

7. The trimming circuit according to claim 6, wherein said decoder provides at least one of a clock command signal and a trim command signal.

8. The trimming circuit according to claim 6, wherein said decoder comprises both a current sensor for sensing changes in said current signal and a voltage sensor for sensing changes in said voltage signal.

9. The trimming circuit according to claim 6, wherein said internal circuit further comprises a ROM programming module for receiving a command signal from said decoder, and for providing a control signal to said device for trimming.

10. An integrated circuit having a controlled trimming procedure, said integrated circuit comprising:
    an electronic device having an output terminal configured in a feedback arrangement, and a supply voltage terminal configured to receive a supply voltage;
    a test system for modifying at least one of a current signal and a voltage signal in at least one existing terminal of said electronic device to indicate a trim command signal; and
    an internal circuit configured for measuring modifications in at least one of said current signal and said voltage signal to determine whether a trim command signal has been provided by said test system to said at least one existing terminal,
    wherein said test system comprises a voltage source configured for modifying said voltage signal in said supply voltage terminal of said electronic device, and
    wherein said test system further comprises at least one current source configured for modifying said current signal flowing in said output terminal of said electronic device.

11. The integrated circuit according to claim 10, wherein said test system comprises at least one current source configured for modifying said current signal flowing in said output terminal of said electronic device.

12. The integrated circuit according to claim 10, wherein said test system comprises a first current sources configured for increasing said current signal flowing in said output terminal of said electronic device, and a second current source configured for decreasing said current signal flowing in said output terminal of said electronic device.

13. The integrated circuit according to claim 10, wherein said at least one current source is configured for indicating a trim signal, and said voltage source is configured for indicating a clock signal.

14. The integrated circuit according to claim 10, wherein said at least one current source is configured for indicating a clock signal, and said voltage source is configured for indicating a trim signal.

15. The integrated circuit according to claim 10, wherein said internal circuit comprises a decoder configured for sensing modifications in current in said current signal and for sensing changes in voltage in said voltage signal.

* * * * *